United States Patent [19]

Kobayashi et al.

[11] 4,305,777

[45] Dec. 15, 1981

[54] METHOD OF PRODUCING FERRITE SINGLE CRYSTALS

[75] Inventors: Toshio Kobayashi, Hinodemachi; Tetsu Oi, Tokyo, both of Japan

[73] Assignee: Hitachi, Ltd., Tokyo, Japan

[21] Appl. No.: 134,868

[22] Filed: Mar. 28, 1980

[30] Foreign Application Priority Data

Apr. 2, 1979 [JP] Japan .................. 54-38379

[51] Int. Cl.³ .............. C30B 11/00; C30B 13/00; C30B 15/00

[52] U.S. Cl. ............. 156/616 R; 156/617 SP; 156/620; 156/DIG. 74; 156/DIG. 89

[58] Field of Search ....... 156/608, DIG. 89, DIG. 74, 156/616 R, 616 A, 617 R, 617 SP, 620; 422/249, 250; 75/65 ZM; 13/DIG. 1

[56] References Cited

FOREIGN PATENT DOCUMENTS 486035 2/1973 Japan .................. 156/608

OTHER PUBLICATIONS

Slick, A Thermogravimetric Study, Jul. 1970, published in "Ferrites: Proceedings of the International Conference", pp. 81–83.

Akashi et al., "Preparation of Ferrite Crystals", published in IEEE Transactions on Magnetics, vol. 5, #3, Sep. 1969, pp. 285–289.

Sugimoto, *Crystal Growth*, from Institute of Physical and Chemical Research, Japan, #15H3.1, Apr. 13, 1976.

Sugimoto et al., Growth and Properties of Ferrites, from Institute of Physical & Chemical Research, Japan, #8A3.2, Jul. 18, 1974.

*Primary Examiner*—Gregory N. Clements
*Attorney, Agent, or Firm*—Craig and Antonelli

[57] ABSTRACT

A method of producing ferrite single crystals which comprises steps of melting a ferrite starting material in oxygen atmosphere containing nitrogen, argon or the like of a partial pressure of at least 0.1 atm. and solidifying the melt. According to this method, the popping out of the gas contained in the melt is prevented and the ferrite single crystals of high qualities can be produced easily.

16 Claims, 2 Drawing Figures

METHOD OF PRODUCING FERRITE SINGLE CRYSTALS

BACKGROUND OF THE INVENTION (i) Field of the Invention

The present invention relates to a method of producing ferrite single crystals. More particularly, the present invention relates to a process for producing ferrite single crystals in an oxygen atmosphere under an oxygen partial pressure higher than that in the air.

(ii) Brief Description of the Prior Art

Ferrite single crystals such as Mn-Zn ferrite, Ni-Zn ferrite, Mn ferrite, Ni ferrite, Co ferrite and Ba ferrite single crystals have been produced mainly by Bridgman's method or flux method in the air.

However, in those methods, ferrite is heated to a high temperature of about 1300° C. in the crystallization step and, therefore, it is thermally dissociated to release oxygen and also to produce FeO, i.e. $Fe^{2+}$, in a large amount. For example, it has been known that if Mn-Zn ferrite having a chemical formula:

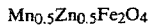
$$Mn_{0.5}Zn_{0.5}Fe_2O_4$$

is molten in the air, FeO formed amounts to 19 wt.%. It has also been known that if the above mentioned Mn-Zn ferrite is molten under an oxygen partial pressure higher than that in the air FeO formed is reduced in amounts as oxygen partial pressure is elevated and that FeO content of said Mn-Zn ferrite is about 2 wt.% when it is molten under an oxygen pressure of 5 atms. FIG. 1 is a graph showing a relationship between FeO content of Mn-Zn ferrite sample which has been kept at 1650° C. for one hour and then cooled and oxygen partial pressure in the atmosphere in which the melting is effected, which graph is given in Mitsuo Sugimoto; "Proceedings of the 5th Symposium organized by Denkitsushin Kenkyu-sho of the Tohoku University, Crystal Growth, Dec. 1967, III-1".

It is desirable to elevate oxygen pressure for controlling amount of $Fe^{2+}$ formed, since the presence of $Fe^{2+}$ exerts a great influence on magnetic properties of the ferrite.

On the other hand, ZnO-containing ferrite single crystals prepared in the air, particularly, Mn-Zn ferrite and Ni-Zn ferrite single crystals, have significantly reduced Zn concentrations as compared with that of the starting material, since ZnO having a high vapor pressure is easily evaporated out at a high temperature.

It has also been known that when Mn-Zn ferrite single crystals having the chemical formula:

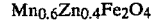
$$Mn_{0.6}Zn_{0.4}Fe_2O_4$$

are grown by Bridgman's method, about 5 wt.% of Zn is evaporated out if it is molten in the air but the evaporation thereof is reduced in amount by elevating oxygen pressure. For example, if oxygen pressure is 5 atms., amount of Zn evaporated is less than 1 wt.% (see said literature).

Thus, if the ferrite single crystals are produced under an elevated oxygen pressure, amounts of FeO produced and Zn evaporated are reduced to obtain favorable results. The ferrite single crystals thus obtained are suitable for the production of a device having excellent magnetic properties.

However, when single crystals are produced in oxygen atmosphere by conventional methods, the gas in the melt pops out (hereinafter this phenomenon will be referred to as popping) to make it impossible to maintain the melt stably and, in addition, this is very dangerous, since the melt is scattered out in drops as the gas pops. Therefore, it has been difficult to obtain ferrite single crystals of high qualities by Bridgman's method, though the production of the single crystals in oxygen atmosphere is barely possible by this method. Still less, the production of ferrite single crystals by floating zone method in oxygen atmosphere has substantially been impossible.

The following references are cited to show the state of the art; (i) A. Ferretti, et al.; Journal of Applied Physics, Vol. 34, No. 2 (February, 1963), pp, 388–389, (ii) A. Ferretti, et al.; Journal of Applied Physics, Vol. 32, No. 5 (May, 1961), p. 905, and (iii) M. Sugimoto; Japan. Journal of Applied Physics, Vol. 5 (1966), pp. 557–558.

SUMMARY OF THE INVENTION

An object of the present invention is to provide an improved method of producing ferrite single crystals in an atmosphere having an oxygen partial pressure higher than that in the air by overcoming the defects of the conventional methods.

The object can be attained by the present invention which comprises melting a starting material of ferrite single crystals in an atmosphere having a total pressure of at least 1 atm and containing (1) at least one gas selected from the group consisting of rare gases, nitrogen and carbon dioxide which gas has a partial pressure of at least 0.1 atm and (2) oxygen having a partial pressure higher than that in the air (usually about 0.2 atm). The starting material of ferrite molten in the above step is then solidified into single crystals. For easily obtaining the single crystals, the melt is solidified on seed crystals in many cases.

As the gas, argon, nitrogen or a mixture thereof is used generally, since it is easily available and inert.

It partial pressure of oxygen in the atmosphere is higher than that in the air in the melting step, the effect of reducing in amount of FeO formed can be obtained. The higher the oxygen partial pressure, the more remarkable the effect. Preferred oxygen partial pressure is higher than 2 atms, particularly higher than 5 atms.

If partial pressure of argon, nitrogen or the like is less than 0.1 atm, the problem of popping in the step of melting the starting material of ferrite cannot be solved and excellent results are unexpectable.

It the total pressure of the atmosphere is less than 1 atm, it is difficult to completely solve the popping problem even if partial pressure of argon, nitrogen or the like is higher than 0.1 atm. Though the highest limit of the total pressure of the atmosphere is not particularly limited, it is desirable to employ a pressure of less than 30 atms from view point of devices and operations.

The method of the present invention of producing ferrite single crystals can be applied to any of floating zone method, Bridgman's method and Czochralski's method to improve effects thereof remarkably. Among them, the effect is particularly remarkable in the floating zone method. In Czochralski's method, a melt is required in a far larger volume as compared with the crystals to be produced; elements constituting the crystals are evaporated out in significant amounts; a crucible used is inclined to be damaged seriously; and segregation of the resulting single crystals is also significant. This problem of the segregation is not solved either by Bridgeman's method. A method of growing single crystals free of said defects is the floating zone method. However, this method has demerits that if a laser, electron rays, or an arc-image is employed for heating, output of heat source is insufficient and, in addition, radiofrequency induction heating technique can be employed only in the production of electroconductive crystals. The inventors invented previously a method of growing single crystals by floating zone technique (hereinafter referred to as new floating zone method) (Japanese Patent Application No. 137,875/1978 filed on Nov. 10, 1978; applied for patent also in the U.S.A. (as application Ser. No. 092,671, filed Nov. 9, 1979), West Germany, France and the Netherlands claiming the Japanese Priority). The present invention can be applied to the new floating zone method to obtain particularly significant effects. In the above mentioned methods of producing single crystals, excluding flux method, the melt is solidified on seed crystals to form single crystals.

For the details of the new floating zone method, see the specification of said patent application.

The new floating zone method comprises steps of (i) placing the starting material at an end of a susceptor heated to a temperature above a melting point of the starting material according to radiofrequency induction heating and placing seed crystals at the other end of the susceptor so as to allow a melt of the starting material to flow from said one end to the other end of the susceptor through the susceptor, thereby contacting the melt with the seed crystals and (ii) moving the seed crystals in a direction opposite to the susceptor at a given speed and feeding the starting material to the end of the susceptor in a given rate. By thus moving the seed crystals in the direction opposite to the susceptor while they are kept in contact with the melt, the melt contacted with the seed crystals is crystallized and further the melt contacted with the crystallized moiety is crystallized successively, whereby the single crystals are grown.

The susceptor must be made of an electroconductive material having a melting point higher than a melting point of the starting material of the crystals and having no reactivity with the melt. When the single crystals are to be grown in oxygen atmosphere or in air, a susceptor made of a material of a high oxidation resistance is used. For example, a susceptor made of platinum or platinum-rhodium alloy is used for the growing of Mn-Zn ferrite single crystals.

Plane shape of the susceptor used is substantially the same as shape of the section of the single crystals to be produced and size of the former is a little larger than the latter. The susceptor has one or plural openings, as occasion demands, through which the melt flows. Generally, a susceptor of plate type is used but it is not limited thereto.

FIG. 2 is a cross section of an embodiment of a device used for the new floating zone method. A rod of starting material 21 is allowed to descend and thereby to contact with a susceptor 23 heated to a temperature above a melting point of the rod by means of a radiofrequency coil 24, whereby the rod is molten on the surface of the susceptor 23. A melt 26 thus formed flows down through openings 27 of the susceptor 23 and thereby crystallized on seed crystals 22 placed below the susceptor 23. A numeral 25 indicates a heat insulator. The rod 21 of starting material and the seed crystals 22 are allowed to descend at a proper speed to grow the single crystals on the seed crystals. If necessary, the rod 21 and the seed crystals 22 are rotated at a suitablerrate.

Feed rate of the rod 21 of starting material is determined in consideration of diameter of the single crystals to be formed and moving rate of the single crystals so that the melt zone would not disappear during the growing of the crystals. Suitable growing rate of the single crystals, i.e. moving rate, is 1–20 mm/hr. If the rate is excessive, polycrystals are formed in a considerable amount in place of the single crystals. Generally, feed rate of the rod of starting material is not necessarily equal to feed rate of the seed crystals or the single crystals. If feed rate of the rod is determined in accordance with the above described conditions, the two rates are different from each other in general.

In case the single crystals to be grown are cylindrical, it is desirable to rotate the seed crystals so as to attain uniform temperature distribution in the melt and to make the outside diameter of the growing crystals uniform. In such a case, preferred rotation speed of the seed crystals is 5–100 rpm. In case a starting material used is in the form of a rod, the melt becomes stable to give favorable results sometimes by rotating the rod at 5–100 rpm in the same direction as or in an opposite direction to the seed crystals.

The method of producing the ferrite single crystals of the present invention can be employed in the production of ferrite single crystals of any type. The term "ferrite" herein indicates metal salts of iron oxides of spinel type, hexagonal type and garnet type. The ferrites of spinel type include Mn-Zn ferrite, Co ferrite, Zn ferrite, Mn ferrite, Ni ferrite, magnetite and Cu ferrite. The ferrites of hexagonal type include Ba ferrite ($BaFe_{12}O_{19}$), W-type ($BaMe_2Fe_{16}O_{27}$), Y-type ($Ba_2Me_2Fe_{12}O_{22}$) and Z-type ($Ba_3Me_2Fe_{24}O_{41}$) wherein Me represents Ca, Sr, Ba or Pb. The ferrites of garnet type include $R_3Fe_5O_{12}$ wherein R represents Y or an element selected from the group consisting of rare earth elements.

Single crystal-growing conditions excluding the atmosphere are not limited but conditions known in the art may be employed.

Among the single crystal production conditions, the inventors noticed particularly growing atmosphere, inter alia, partial pressure of oxygen and partial pressure of a gas incorporated in oxygen. After experiments of growing single crystals wherein partial pressure of the gas additive was varied to know there was any popping, the inventors have found that the popping phenomenon disappears if nitrogen, argon or the like having a partial pressure of at least 0.1 atms is added to oxygen and, consequently, ferrite single crystals can be produced easily by Bridgman's method, new floating zone method or the like under oxygen pressure. The present invention has been completed on the basis of this finding.

DESCRIPTION OF THE PRESENTLY PREFERRED EMBODIMENTS

EXAMPLE 1

Figure 1:
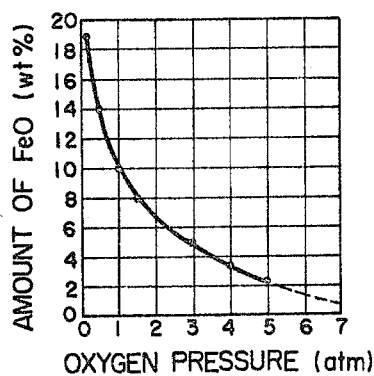
FIG. 1 is a graph showing a relationship between amount of FeO in Mn-Zn ferrite and partial pressure of oxygen in the atmosphere when the Mn-Zn ferrite is heated to 1650° C.
Figure 2:
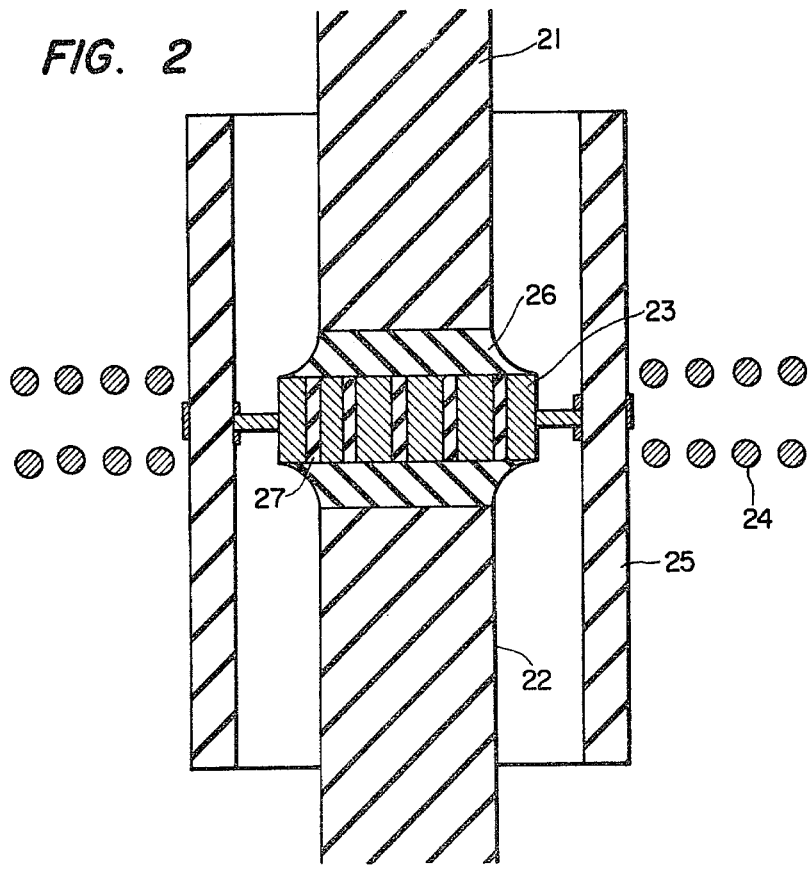
FIG. 2 is a cross section of an embodiment of a device for the new floating zone method which exhibits great effects when the present invention is applied thereto.

Mn-Zn Ferrite single crystals were grown from a rod of sintered compact of Mn-Zn ferrite having the chemical formula: $Mn_{0.6}Zn_{0.4}Fe_2O_4$. The rod had an outside diameter of 10 mm. Feed rate of the rod was 6 mm/hr, growing rate of the single crystals was 6 mm/hr and rotation rate of the single crystals was 20 rpm. A susceptor made of Pt-20%Rh alloy was in the form of a disc having a thickness of 3 mm and a diameter of 14 mm. The susceptor had 4 openings of a diameter of 2 mm through which the melt flows. The atmosphere comprised oxygen added with nitrogen or argon. Single crystals of the ferrite were grown under varied partial pressures of those gases. The results of the experiments are shown in Table 1. The resulting single crystals had a diameter of about 8 mm and a length of 70 mm.

TABLE 1

| Exp. No. | Partial pressure of oxygen (atms.) | Partial pressure of gaseous additive (atms) | Pop-ping | Amount of FeO formed (wt. %) | Amount of Zn evaporated (wt. %) |
|---|---|---|---|---|---|
| 1 | 1 | (None) | Popped | Cracks were quite remarkable in the single crystals | |
| 2 | 4 | " | " | Cracks were quite remarkable in the single crystals | |
| 3 | 12 | " | " | Cracks were quite remarkable in the single crystals | |
| 4 | 5 | $N_2$:0.05 | " | Cracks were quite remarkable in the single crystals | 0.8 |
| 5 | 2 | $N_2$:0.1 | None | 6.3 | 2.3 |
| 6 | 7 | Ar:0.1 | " | 0.8 | 0.4 |
| 7 | 4 | $N_2$:0.2 | " | 3.2 | 1.2 |
| 8 | 2 | $N_2$:0.5 | " | 5.8 | 2.1 |
| 9 | 5 | $N_2$:0.8 | " | 1.6 | 0.7 |
| 10 | 10 | Ar:0.8 | " | 0.07 | 0.03 |
| 11 | 5 | Ar:1.5 | " | 1.8 | 0.6 |
| 12 | 15 | $N_2$:1.5 | " | 0.03 | 0.02 |
| 13 | 2 | Ar:2 | " | 6.2 | 2.0 |
| 14 | 5 | $N_2$:2 | " | 2.3 | 0.7 |
| 15 | 5 | $N_2$:5 | " | 1.9 | 0.5 |
| 16 | 10 | Ar:5 | " | 0.2 | 0.03 |
| 17 | 10 | Ar:8 | " | 0.08 | 0.01 |
| 18 | 15 | $N_2$:8 | " | 0.05 | 0.01 |

It is apparent from Table 1 that when the single crystals were formed in pure oxygen atmosphere, the popping was caused and, therefore, the resulting Mn-Zn ferrite single crystals have numerous cracks. When the Mn-Zn ferrite single crystals were grown in oxygen atmosphere containing nitrogen or argon of a partial pressure of higher than 0.1 atm, the popping was not observed, stable growing of the single crystals was possible and the resulting single crystals had no crack. Amount of FeO in the resulting single crystals and amount of Zn evaporated which were calculated out by chemical analysis are also shown in Table 1. It is noted from Table 1 that amount of FeO formed and amount of Zn evaporated out are reduced and the composition of the resulting single crystals becomes close to that of the starting material as pressure of oxygen in the atmosphere is elevated.

When the single crystals were formed in the air, composition of the resulting single crystals was quite different from that of the starting material rod, since considerable amounts of FeO and Zn had been formed and evaporated out, respectively.

EXAMPLE 2

Ferrite single crystals were produced in the same manner as in Example 1 except that a rod of Ni-Zn ferrite, Mn ferrite, Ni ferrite or Ba ferrite was used in place of the rod of Mn-Zn ferrite. Partial pressures of oxygen and nitrogen or argon in the atmosphere were 3-15 atms and 0.2-5 atms, respectively. The results are shown in Table 2.

It is apparent from Table 2 that ferrite single crystals of those verieties having a low FeO content can be produced stably in oxygen atmosphere added with nitrogen or argon.

TABLE 2

| Exp. No. | Starting material | Partial pressure of oxygen (atms.) | Partial pressure of gaseous additive (atms.) | Pop-ping | State of crystals, Amount of FeO formed (wt. %) |
|---|---|---|---|---|---|
| 19 | $Ni_{0.5}Zn_{0.5}Fe_2O_4$ | 3 | (None) | Popped | Cracks were quite remarkable in the single crystals |
| 20 | " | 5 | $N_2$:0.2 | None | 1.6 |
| 21 | " | 10 | Ar:1.5 | None | 0.3 |
| 22 | " | 15 | $N_2$:2 | None | 0.05 |
| 23 | " | 8 | $N_2$:3 | None | 0.7 |
| 24 | " | 5 | $N_2$:5 | None | 1.2 |
| 25 | $MnFe_2O_4$ | 5 | (None) | Popped | Cracks were quite remarkable in the single crystals |
| 26 | " | 5 | $N_2$:0.1 | None | 1.4 |
| 27 | " | 5 | Ar:0.2 | None | 1.3 |
| 28 | " | 8 | $N_2$:1 | None | 1.0 |
| 29 | " | 15 | $N_2$:5 | None | 0.03 |
| 30 | $NiFe_2O_4$ | 4 | $N_2$:1 | None | 2.2 |
| 31 | " | 6 | $N_2$:2 | None | 1.3 |
| 32 | $BaFe_{12}O_{19}$ | 3 | $N_2$:1 | None | 1.1 |
| 33 | " | 5 | $N_2$:2 | None | 0.7 |

EXAMPLE 3

Mn-Zn Ferrite or Ni-Zn ferrite having the same composition as in Example 1 or 2 was charged in a Pt-20%Rh alloy crucible and single crystals were grown according to Bridgman's method. Single crystal growing rate was 4 mm/hr. The atmosphere comprised oxygen of a partial pressure of 5-10 atms. and nitrogen or argon gas of a partial pressure of 0.5-2 atms. The crucible had a diameter of 20 mm and a length of 70 mm.

The resulting single crystals had a diameter of 20 mm and a length of 50 mm. Single crystals grown near the mouth of the crucible at which Zn is considered to evaporate out in the largest amount had a Zn content which was not remarkably different from that of the starting material. FeO formed was less than 1 wt. %. However, a considerable Mn segregation was observed in the ferrite single crystals produced according to Bridgman's method. Proportion of a desirable composition was only about 15% in the product.

Though only argon was used as a typical rare-gas in the above examples, it is to be noted that the similar effects can also be obtained when other rare-gases such as helium, neon, xenon and krypton are used. In addition, the similar effects can also be obtained when carbon dioxide is used. As a matter of course, those gaseous additives may be used either alone or in the form of a mixture.

The single crystal growing conditions in the method of the present invention of producing ferrites are not limited to those described in the above examples. By combining the atmosphere conditions of the present invention as described above in detail with the single crystal growing conditions of the prior art, single crystals of high qualities can be obtained easily.

As compared with single crystals grown in the air according to conventional methods, the ferrite single crystals produced by the method of the present invention have a far lower FeO content. ZnO concentrations in Mn-Zn ferrite and Ni-Zn ferrite are substantially equal to those of the starting materials favorably.

What is claimed is:

1. A method of producing ferrite single crystals from a melt comprising: (i) a step of melting a ferrite starting material in an atmosphere comprising at least one gas selected from the group consisting of rare-gases, nitrogen and carbon dioxide having a partial pressure of at least 0.1 atm and oxygen having a partial pressure higher than that in the air under a total pressure of at least 1 atm, and (ii) a step of solidifying the ferrite starting material molten in step (i) into a single crystal by anyone of the Bridgman's, Czochralski's, or the floating zone method, whereby popping of gas in the melt is substantially prevented.

2. A method of producing ferrite single crystals according to claim 1 wherein said gas is at least one of argon and nitrogen.

3. A method of producing ferrite single crystals according to claim 1 wherein the partial pressure of oxygen is at least 2 atms.

4. A method of producing ferrite single crystals according to claim 3 wherein the partial pressure of oxygen is at least 5 atms.

5. A method of producing ferrite single crystals according to claim 1, 2, 3 4 or 6 wherein the ferrite single crystal is grown by floating zone method.

6. A method of producing ferrite single crystals according to claim 5 wherein the ferrite single crystal is grown by a single crystal-growing method which comprises placing the starting material at an end of a susceptor heated to a temperature above a melting point of the starting material by radiofrequency induction heating and placing seed crystals at the other end of the susceptor so as to allow a melt of the starting material to flow from said one end to the other end of the susceptor through the susceptor, thereby contacting the melt with the seed crystals, and a step of moving the seed crystals in a direction opposite to the susceptor at a given speed and feeding the starting material to the end of the susceptor in a given rate.

7. A method of producing ferrite single crystals according to claim 1, 2, 3 or 4 wherein the ferrite single crystal is grown by Bridgman's method.

8. A method of producing ferrite single crystals according to claim 1, wherein the partial pressure of oxygen is greater than 0.2 atms.

9. A method of producing ferrite single crystals according to claim 6, wherein the single crystals formed are cylindrical.

10. A method of producing ferrite single crystals according to claim 9, wherein said seed crystals are rotated.

11. A method of producing ferrite single crystals according to claim 10, wherein the seed crystals are rotated at 5–100 rpm.

12. A method of producing ferrite single crystals according to claim 11, wherein the starting material is in the form of a rod.

13. A method of producing ferrite single crystals according to claim 12, wherein the starting material is rotated.

14. A method of producing ferrite single crystals according to claim 13, wherein the starting material is rotated at 5–100 rpm.

15. A method of producing ferrite single crystals according to claim 1, wherein the total pressure is 1–30 atm.

16. A method of producing ferrite single crystals according to claim 1, wherein the at least one gas is selected from the group consisting of argon, helium, neon, xenon, krypton and carbon dioxide.

* * * * *